United States Patent [19]
Susak

[11] Patent Number: 6,118,400
[45] Date of Patent: Sep. 12, 2000

[54] CAPACITOR ARRAY FOR A SUCCESSIVE APPROXIMATION REGISTER (SAR) BASED ANALOG TO DIGITAL (A/D) CONVERTER AND METHOD THEREFOR

[75] Inventor: David Susak, Phoenix, Ariz.

[73] Assignee: Microchip Technology Incorporated, Chandler, Ariz.

[21] Appl. No.: 09/009,285

[22] Filed: Jan. 20, 1998

[51] Int. Cl.[7] .................................................. H03M 1/42
[52] U.S. Cl. ............................................ 341/172; 341/161
[58] Field of Search ................................... 341/172, 161, 341/155, 144

[56] References Cited

U.S. PATENT DOCUMENTS 5,870,052  2/1999  Dedic et al. ............................ 341/161
5,929,800  7/1999  Zhou et al. ............................. 341/161

Primary Examiner—Brian Young
Attorney, Agent, or Firm—Paul N. Katz; Ronald L. Chichester; Frohwitter

[57] ABSTRACT

A capacitor array for a Successive Approximation Register (SAR) based Analog to Digital (A/D) converter. The capacitor array is a capacitive ladder comprising a plurality of capacitive branches. Each capacitive branch is individually coupled to a separate bit of a driver circuit. Each of the plurality of capacitive branches drives an approximately same capacitive value while generating a binary weighted output voltage.

15 Claims, 2 Drawing Sheets

CAPACITOR ARRAY FOR A SUCCESSIVE APPROXIMATION REGISTER (SAR) BASED ANALOG TO DIGITAL (A/D) CONVERTER AND METHOD THEREFOR

RELATED APPLICATION

This application is related to the applications entitled "A SUCCESSIVE APPROXIMATION REGISTER (SAR) FOR CONTROLLING SAMPLING AND CONVERSION OF AN ANALOG TO DIGITAL (A/D) CONVERTER AND METHOD THEREFOR", in the name of Prado et al., and "A DRIVER CIRCUIT FOR LOW VOLTAGE OPERATION OF A SUCCESSIVE APPROXIMATION REGISTER (SAR) ANALOG TO DIGITAL (A/D) CONVERTER AND METHOD THEREFOR", in the name of the same inventor as the present Application, all filed concurrently herewith, and assigned to the same assignee as this Application. The disclosures of the above referenced applications are hereby incorporated by reference into this application.

BACKGROUND OF THE INVENTION

1. Field of the Invention

This invention relates generally to Analog to Digital (A/D) converters and, more specifically, to a capacitor array for a Successive Approximation Register (SAR) based Analog to Digital (A/D) converter and a method therefor.

2. Description of the Prior Art

Currently in a Successive Approximation Register (SAR) based Analog to Digital (A/D) converter, an SAR is used to signal a driver circuit to activate different columns of a capacitor array. The driver circuit is presently made up of a plurality of cells wherein each cell is used to drive a respective column of the capacitor array.

Presently, the capacitor array used in the SAR based A/D converter is a binary weighted capacitor array. In order to obtain binary weighted voltage outputs, each branch drives a capacitance value of $2^n C$ where n is an integer greater than or equal to 0, C is the value of a unit capacitor, and each branch has a different value for n. In order to avoid fringing capacitance problems and to obtain capacitor matching, each branch is comprised of a plurality of unit capacitors C (i.e., $2^n C$) coupled together in parallel. For larger bits of resolution, this creates a routing nightmare as well as parasitic problems since the binary weighted capacitor array will need to drive a large number of unit capacitors C. For example, for 10 bits of resolution, 1024 unit capacitors C (i.e., $2^{10} C$) need to be driven.

Therefore, a need existed to provide an improved capacitor array for an SAR based A/D converter. The improved capacitor array must generated a binary weighted voltage output while using substantially less unit capacitors than a conventional prior art binary weighted capacitor array. The improved capacitor array will have a plurality of branches which switch at the same speed thereby increasing the overall speed of the SAR based A/D converter.

SUMMARY OF THE INVENTION

In accordance with one embodiment of the present invention, it is an object of the present invention to provide an improved capacitor array for an SAR based A/D converter.

It is another object of the present invention to provide an improved capacitor array that generates a binary weighted voltage output while using substantially less unit capacitors than a conventional prior art binary weighted capacitor array.

It is still another object of the present invention to provide an improved capacitor array that will have a plurality of branches which switch at the same speed thereby increasing the overall speed of the SAR based A/D converter.

BRIEF DESCRIPTION OF THE PREFERRED EMBODIMENTS

In accordance with one embodiment of the present invention, a capacitor array for a Successive Approximation Register (SAR) based Analog to Digital (A/D) converter is disclosed. The capacitor array has a plurality of capacitive branches. Each capacitive branch is individually coupled to a separate bit of a driver circuit and each capacitive branch drives an approximately same capacitive value while generating a binary weighted output voltage.

In accordance with another embodiment of the present invention, a method of providing a capacitor array for a Successive Approximation Register (SAR) based Analog to Digital (A/D) converter is disclosed. The method comprises the step of providing a plurality of capacitive branches wherein each capacitive branch is individually coupled to a separate bit of a driver circuit and each of the plurality of capacitive branches drives an approximately same capacitive value while generating a binary weighted output voltage.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
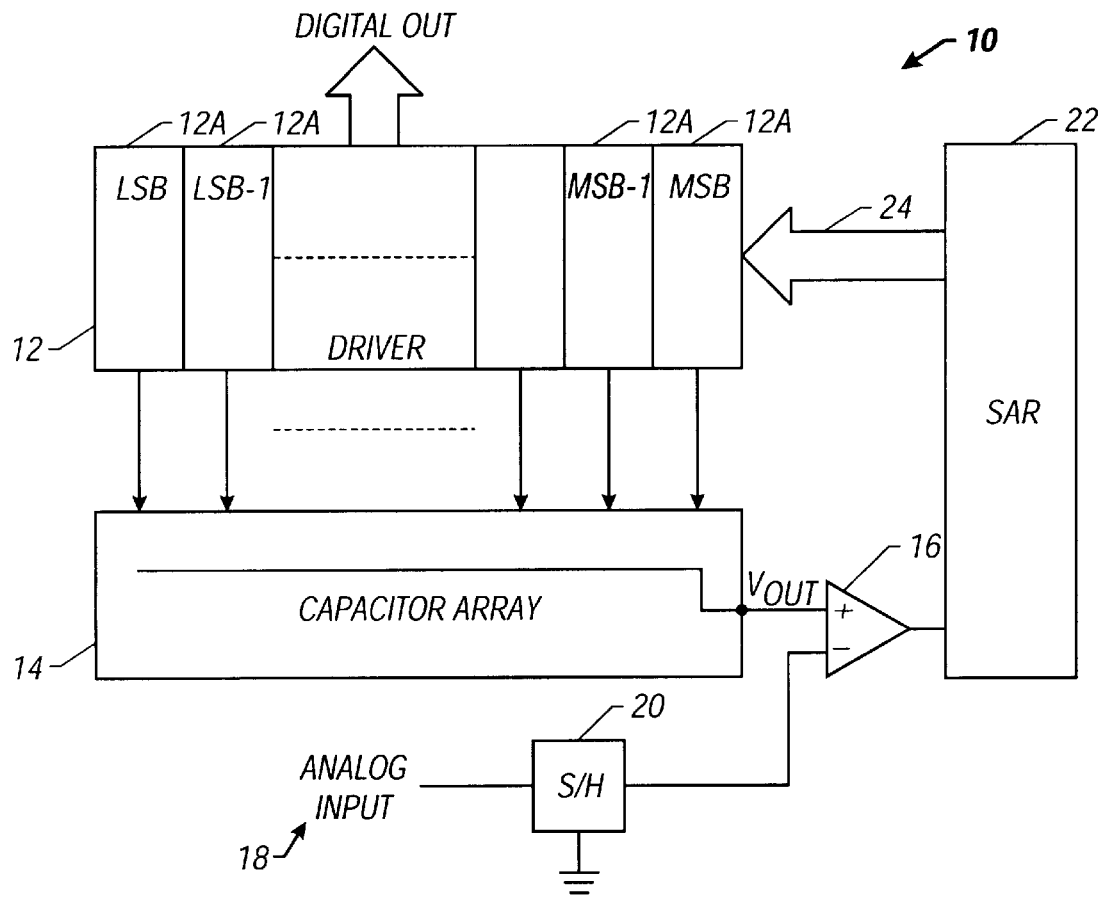
FIG. 1 is a simplified functional block diagram of an Analog to Digital (A/D) converter.

Referring to FIG. 1, an Analog to Digital (A/D) converter 10 is shown. The A/D converter 10 uses a driver circuit 12 for driving each column of a capacitor array 14. The driver circuit 12 is comprised of a plurality of cells 12A. Each cell 12A is used to drive a specific column or bank of the capacitor array 14. By activating and deactivating each bank within the capacitor array 14, the driver circuit 12 may control the output voltage $V_{out}$ of the capacitor array 14.

The output voltage $V_{out}$ of the capacitor array 14 is sent to one input of a comparator 16. A second input of the comparator 16 is coupled to an output of a sampling circuit 20. The sampling circuit 20 has an input coupled to an analog input signal 18. The sampling circuit 20 will sample the analog input signal 18 at timed intervals and send the sampled signal to the comparator 16. The comparator 16 will then compare the voltage of the sampled signal to that of the output voltage $V_{out}$ of the capacitor array 14.

After comparing the two input voltage levels, the comparator 16 will send a signal to a Successive Approximation Register (SAR) 22 on whether the output voltage $V_{out}$ was higher or lower than the sampled voltage. The SAR 22 will then signal the driver circuit 12 over bus 24 on which rows of the capacitor array 14 need to be activated and/or deactivated.

In operation, the Most Significant Bit (MSB) of the driver circuit 12 is first set high while all the other bits 12A in the driver circuit 12 are set to zero. The comparator 16 will then compare the output voltage $V_{out}$ of the capacitor array 14 to the sampled voltage from the sampling circuit 20. If $V_{out}$ is greater than the sampled voltage level, the comparator 16 will signal the SAR 22 that the output voltage $V_{out}$ has over shot the sampled voltage. The SAR 22 will then send a signal via bus 24 to the driver circuit 12 to set the MSB to zero. The entire process is now repeated for the next cell 12A (i.e., MSB−1). If the output voltage $V_{out}$ does not overshoot the sampled voltage signal, then the cell 12A is a valid bit and is set high. The entire process is carried out for every cell 12A. The driver circuit 12 may then generate a digital output based on the settings of the cells 12A.

Figure 2:
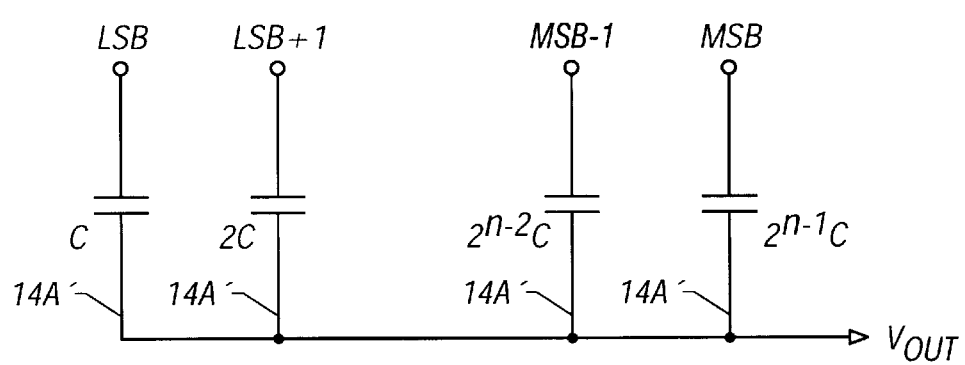
FIG. 2 is a simplified functional block diagram of a prior art capacitor array used in the A/D converter depicted in FIG. 1.

Referring to FIG. 2, wherein like numerals and symbols represent like elements with the exception of the use of a "'" to indicate a different embodiment, a prior art capacitor array 14' is shown. The capacitor array 14' depicted in FIG. 2 is a binary weighted capacitor array 14'. In the binary weighted capacitor array 14', each capacitor bank 14A' has a capacitance value equal to approximately $2^n$ where n is an integer greater than or equal to 0. Each capacitor bank 14A' is generally comprised of a plurality of unit capacitors C coupled together in parallel to achieve the capacitor bank's desired capacitive value.

The problem with the binary weighted capacitor array 14' is that for higher bits of resolution, a large number of unit capacitors C are required. For example, for 8 bits of resolution, 256 unit capacitors C are needed, for 10 bits of resolution 1024 unit capacitors C are required, and for 16 bits of resolution 65,536 unit capacitors C are required. Thus, for larger bits of resolution, the binary weighted capacitor array 14' creates a routing nightmare. Furthermore, the binary weighted capacitor array 14' may have parasitic problems since the binary weighted capacitor array 14' will need to drive a large number ($2^nC$) of unit capacitors.

Figure 3:
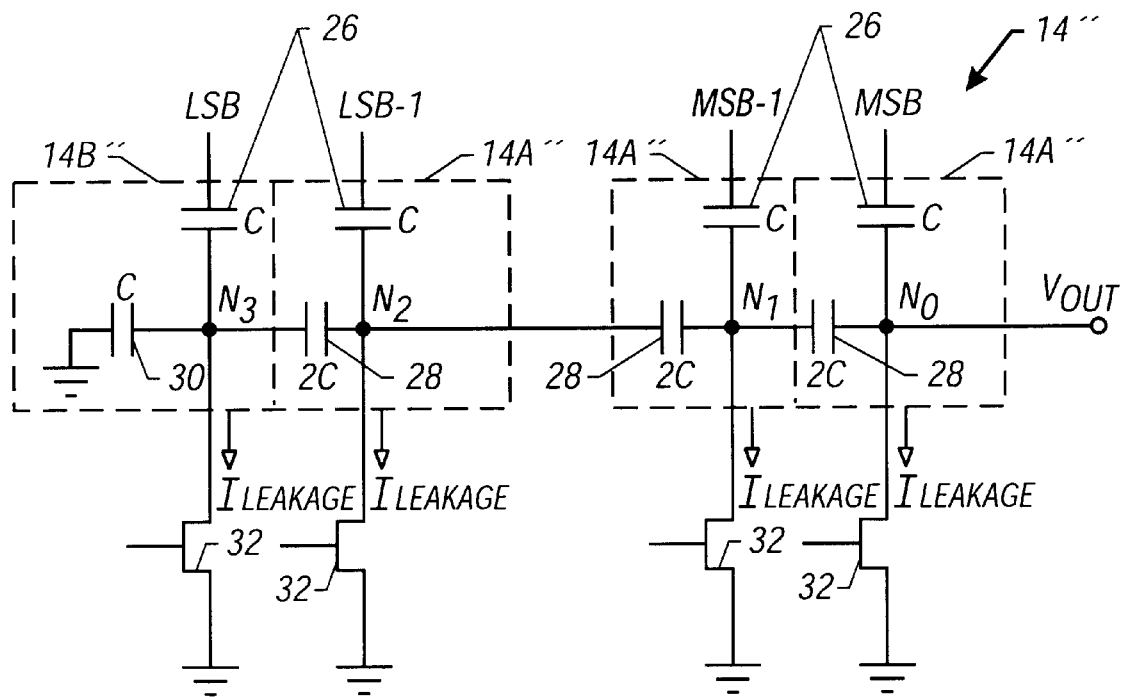
FIG. 3 is a simplified functional block diagram of the capacitive ladder of the present invention used in the A/D converter depicted in FIG. 1.
Figure 4:
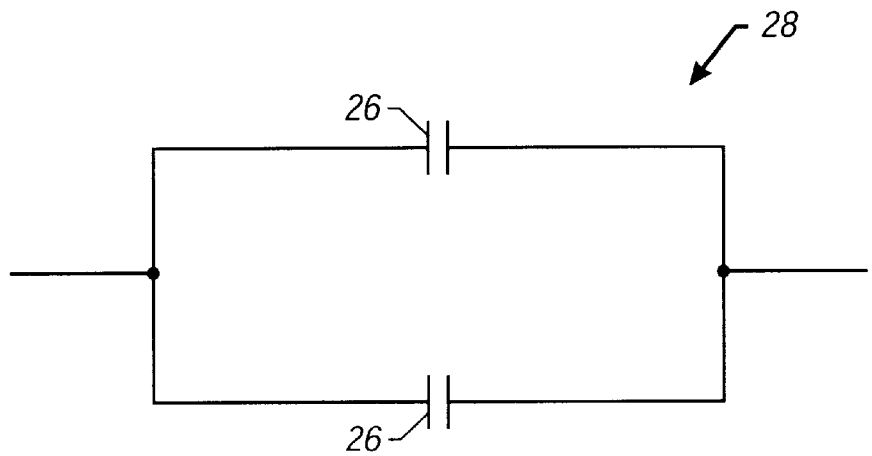
FIG. 4 is a simplified electrical schematic of part of a capacitive branch of the capacitive ladder depicted in FIG. 3.

Referring now to FIG. 3 were like numerals and symbols represent like elements with the exception of the use of a "''" to indicate a different embodiment, an improved capacitor array 14" is shown. The capacitor array 14" is a capacitive ladder 14". The capacitive ladder 14" is comprised of a plurality of capacitive branches 14A". Each of the capacitive branches 14A" (with the exception of the last capacitive branch 14B" which is coupled to the LSB) is comprised of a capacitor 26 having a unit capacitance value of C. The capacitor 26 has a first terminal which is coupled to a bit 12A (FIG. 1) in the driver circuit 12 (FIG. 1). The second terminal of the capacitor 26 is coupled to a capacitor circuit 28 having a capacitance value of 2c. In order to avoid fringing capacitance and matching problems, each capacitor in the capacitive ladder 14" should have a constant perimeter to area ratio. Thus, the capacitor circuit 28 is comprised of two capacitors 26 coupled together in parallel wherein each capacitor 26 has a unit capacitance value of C (FIG. 4).

The last capacitive branch 14B" is also comprised of a capacitor 26 having a unit capacitance value of C. The capacitor 26 has a first terminal which is coupled to the LSB 12A (FIG. 1) of the driver circuit 12 (FIG. 1). The second terminal of the capacitor 26 is coupled to the first terminal of a second capacitor 30. The second terminal of the second capacitor 30 is coupled to ground. The second capacitor 30 has a capacitance value of C.

In the embodiment depicted in FIG. 3, an NMOS transistor 32 is coupled to each of the nodes $n_0$, $n_1$, $n_2$, and $n_3$. The NMOS transistor 32 is used to drive each of the nodes ($n_0$, $n_1$, $n_2$, and $n_3$) to a known voltage level prior to each conversion. In the embodiment depicted in FIG. 3, the NMOS transistors 32 are used to drive each of the nodes ($n_0$, $n_1$, $n_2$, and $n_3$) to ground. However, it should be noted that other devices may be used to drive each the nodes ($n_0$, $n_1$, $n_2$, and $n_3$) to a predetermined value and that the NMOS transistor 32 is just one of many such devices.

The NMOS transistors 32 may cause a parasitic leakage problem. Parasitic leakage will effect the capacitive ladder 14" at high temperatures. Generally, parasitic leakage will affect the output node ($V_{out}$) the most. As one moves down the capacitive ladder 14", the leakage goes down exponentially (approximately $½^n$) and does not affect the output.

For a four bit capacitive ladder 14" (MSB, MSB−1, LSB+1, and LSB), if the MSB is high, the output voltage $V_{out}$ will be $½ V_{Full}$ where $V_{FuLL}$ is the full scale value of the output voltage $V_{out}$. If the MSB−1 bit is held high, $V_{out}$ will be $¼ V_{FuLL}$. If the LSB+1 bit is held high, $V_{out}$ will be $⅛ V_{FuLL}$. If the LSB bit is held high, $V_{out}$ will be $1/16 V_{FuLL}$. Thus, the capacitive ladder 14" will generate a binary weighted output voltage while using considerably less capacitors than the prior art binary weighted capacitor array 14' (FIG. 2). By using the capacitive ladder 14", the number of unit capacitors C increases linearly with increasing bits of resolution. In contrast, for a binary weighted capacitor array 14' (FIG. 2), the number of unit capacitors C goes up exponentially when the bits of resolution increases. For the capacitive ladder 14", the number of unit capacitors is approximately equal to 3n−1 where n is the total number of the bits of resolution. For the prior art binary weighted capacitor array 14', the number of unit capacitors is approximately equal to $2^n$ where n is the total number of the bits of resolution. Thus, for 10 bits of resolution, the capacitive ladder 14" of the present invention will require only 29 unit capacitors C, while the prior art binary weighted capacitor array 14' will require 1024. For 14 bits of resolution, the capacitive ladder 14" of the present invention will only require 41 unit capacitors C, while the prior art binary weighted capacitor array 14' will require 16,384.

By selecting each capacitive branch 14A" to be a C, 2C combination, each branch of the capacitive ladder 14" has the same equivalent capacitance, 2C. Likewise, the last capacitive branch 14B" also has an equivalent capacitance of 2C (capacitors 26 and 30 both having a capacitance value of C coupled together in parallel). Thus, each capacitive branch 14A" and 14B" will be the same size and will switch at the same speed. This will increase the overall speed of the SAR based A/D converter. In contrast, in prior art SAR based A/D converters using a binary weighted capacitor array 14', for 10 bits of resolution, it would be difficult and slow to drive 1024 unit capacitors. Furthermore, a lot of spike current would be generated by driving 1024 unit capacitors.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A capacitor array for a Successive Approximation Register (SAR) based Analog to Digital (A/D) converter comprising a plurality of capacitive branches wherein each capacitive branch is individually coupled to a separate bit of a driver circuit and each of said plurality of capacitive branches drives an approximately same capacitive value while generating a binary weighted output voltage.

2. A capacitor array in accordance with claim 1 wherein said plurality of capacitive branches comprises:
   a first capacitive branch, said first capacitive branch comprising:
      a first capacitor having a first terminal coupled to said driver circuit; and
      a second capacitor having a capacitive value approximately equal to said first capacitor and having a first terminal coupled to a second terminal of said first capacitor and a second terminal coupled to ground; and
   at least one second capacitive branch, said at least one second capacitive branch comprising:
      a first capacitor having a first terminal coupled to said driver circuit wherein said first capacitor of said at least one second capacitive branch has a capacitive value approximately equal to said first capacitor of said first capacitive branch, and
      a capacitor circuit having a capacitive value approximately equal to two times said first capacitor of said at least one second capacitive branch and having a first terminal coupled to a second terminal of said first capacitor and a second terminal coupled to said second terminal of said first capacitor of a directly succeeding capacitive branch.

3. A capacitor array in accordance with claim 2 wherein said capacitor circuit of said at least one second capacitive branch comprises a pair of capacitors coupled together in parallel wherein each capacitor of said pair of capacitors has a capacitive value approximately equal to said first capacitor of said at least one second capacitive branch.

4. A capacitor array in accordance with claim 1 wherein said plurality of capacitive branches comprises:
   a first capacitive branch, said first capacitive branch comprising:
      a first capacitor having a first terminal coupled to said driver circuit; and
      a second capacitor having a capacitive value approximately equal to said first capacitor and having a first terminal coupled to a second terminal of said first capacitor and a second terminal coupled to ground; and
   a plurality of second capacitive branches, each of said plurality of second capacitive branches comprising:
      a first capacitor having a first terminal coupled to said driver circuit wherein said first capacitor of each of said plurality of second capacitive branches has a capacitive value approximately equal to said first capacitor of said first capacitive branch, and
      a capacitor circuit having a capacitive value approximately equal to two times said first capacitor of said second capacitive branch and having a first terminal coupled to a second terminal of said first capacitor and a second terminal coupled to said second terminal of said first capacitor of a directly succeeding capacitive branch.

5. A capacitor array in accordance with claim 4 wherein said capacitor circuit of said at least one second capacitive branch comprises a pair of capacitors coupled together in parallel wherein each capacitor of said pair of capacitors has a capacitive value approximately equal to said first capacitor of said at least one second capacitive branch.

6. A capacitor array in accordance with claim 1 further comprising a plurality of initializing circuits wherein a single initializing circuit is coupled to each of said plurality of capacitive branches to initial each capacitive branch to an initial value for eliminating errors due to capacitor mismatch.

7. A capacitor array for a Successive Approximation Register (SAR) based Analog to Digital (A/D) converter comprising a plurality of capacitive branches wherein each capacitive branch is individually coupled to a separate bit of a driver circuit and each of said plurality of capacitive branches drives an approximately same capacitive value while generating a binary weighted output voltage, each of said plurality of capacitive branches comprising:
   a first capacitive branch, said first capacitive branch comprising:
      a first capacitor having a first terminal coupled to said driver circuit; and
      a second capacitor having a capacitive value approximately equal to said first capacitor and having a first terminal coupled to a second terminal of said first capacitor and a second terminal coupled to ground; and
   at least one second capacitive branch, said at least one second capacitive branch comprising:
      a first capacitor having a first terminal coupled to said driver circuit wherein said first capacitor of said at least one second capacitive branch has a capacitive value approximately equal to said first capacitor of said first capacitive branch, and
      a capacitor circuit having a capacitive value approximately equal to two times said first capacitor of said at least one second capacitive branch and having a first terminal coupled to a second terminal of said first capacitor and a second terminal coupled to said second terminal of said first capacitor of a directly succeeding capacitive branch.

8. A capacitor array in accordance with claim 7 wherein said capacitor circuit of said at least one second capacitive branch comprises a pair of capacitors coupled together in parallel wherein each capacitor of said pair of capacitors has a capacitive value approximately equal to said first capacitor of said at least one second capacitive branch.

9. A capacitor array in accordance with claim 7 further comprising a plurality of second capacitive branches.

10. A capacitor array in accordance with claim 7 further comprising a plurality of initializing circuits wherein a single initializing circuit is coupled to each of said plurality of capacitive branches to initial each capacitive branch to an initial value for eliminating errors due to capacitor mismatch.

11. A method of providing a capacitor array for a Successive Approximation Register (SAR) based Analog to Digital (A/D) converter comprising the step of providing a plurality of capacitive branches wherein each capacitive branch is individually coupled to a separate bit of a driver circuit and each of said plurality of capacitive branches drives an approximately same capacitive value while generating a binary weighted output voltage.

12. The method of claim 11 wherein said step of providing a plurality of capacitive branches further comprises the steps of:
   providing a first capacitive branch, said step of providing said first capacitive branch further comprising the steps of:
      providing a first capacitor having a first terminal coupled to said driver circuit; and
      providing a second capacitor having a capacitive value approximately equal to said first capacitor and having a first terminal coupled to a second terminal of said first capacitor and a second terminal coupled to ground; and providing at least one second capacitive branch, said step of providing at least one second capacitive branch further comprising the steps of:

provided a first capacitor having a first terminal coupled to said driver circuit wherein said first capacitor of said at least one second capacitive branch has a capacitive value approximately equal to said first capacitor of said first capacitive branch, and providing a capacitor circuit having a capacitive value approximately equal to two times said first capacitor of said at least one second capacitive branch and having a first terminal coupled to a second terminal of said first capacitor and a second terminal coupled to said second terminal of said first capacitor of a directly succeeding capacitive branch.

13. A capacitor array in accordance with claim 12 wherein said step of providing said capacitor circuit of said at least one second capacitive branch further comprises the step of providing a pair of capacitors coupled together in parallel wherein each capacitor of said pair of capacitors has a capacitive value approximately equal to said first capacitor of said at least one second capacitive branch.

14. The method of claim 12 further comprising the step of providing a plurality of second capacitive branches.

15. The method of claim 11 further comprising the step of providing a plurality of initializing circuits wherein a single initializing circuit is coupled to each of said plurality of capacitive branches to initial each capacitive branch to an initial value for eliminating errors due to capacitor mismatch.

* * * * *